United States Patent [19]

Hersom et al.

[11] 4,292,665

[45] Sep. 29, 1981

[54] OUTPUT STAGE FOR SWITCHING REGULATED POWER SUPPLY

[75] Inventors: Wallace N. Hersom, Tustin; John E. Crum, Mission Viejo, both of Calif.

[73] Assignee: LH Research, Tustin, Calif.

[21] Appl. No.: 111,833

[22] Filed: Jan. 14, 1980

Related U.S. Application Data

[63] Continuation-in-part of Ser. No. 908,563, May 23, 1978, Pat. No. 4,184,211.

[51] Int. Cl.³ ............................................. H02M 1/00
[52] U.S. Cl. ..................................... 363/141; 363/67
[58] Field of Search ................... 307/150, 151; 323/48; 336/200, 222, 175; 363/22–25, 39, 44, 45, 53, 67, 69, 70, 114, 116, 125, 126, 141, 144, 146

[56] References Cited

U.S. PATENT DOCUMENTS

| | | | |
|---|---|---|---|
| 2,714,648 | 8/1955 | Blok et al. | 336/222 X |
| 3,363,165 | 1/1968 | Wilkinson | 323/48 X |
| 3,745,440 | 7/1973 | Lord | 323/48 X |
| 4,020,411 | 4/1977 | Tsuboi et al. | 363/44 X |
| 4,103,267 | 7/1978 | Olschewski | 336/200 X |
| 4,106,087 | 8/1978 | Kawasaki | 363/70 |

Primary Examiner—William M. Shoop
Attorney, Agent, or Firm—Knobbe, Martens, Olson, Hubbard & Bear

[57] ABSTRACT

In an output stage for switching regulated power supply, including a step down transformer and a full wave rectifier, significantly increased power output and a small, compact size are achieved by reducing the length of the path through which electrical power must flow in the power supply, by symmetrically arranging all electrical paths within the power supply, and by utilizing single turn windings, each associated with a diode rectifier element. Two groups of diodes are respectively mounted on two heat sinks which are arranged in parallel co-planar relationship under a circuit board on which the transformer is mounted. In a first embodiment, the first group of diodes is forwardly mounted on the heat sink, that is, with their anodes exposed, while the other diodes are reversely mounted on the other heat sink. In a second embodiment, all diodes are forwardly mounted on the heat sinks. The single turn secondary windings are connected to the diodes at interfaces symmetrically positioned around the periphery of the core of the transformer.

19 Claims, 12 Drawing Figures

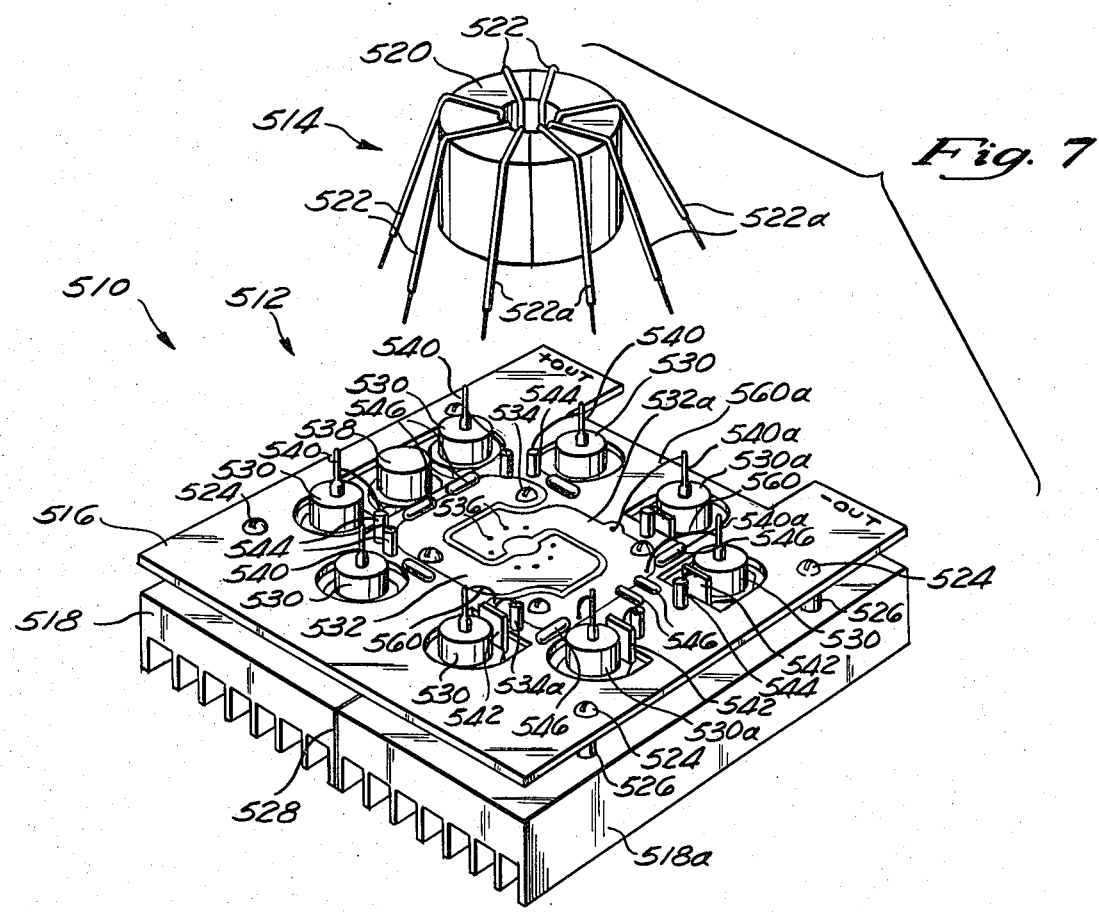
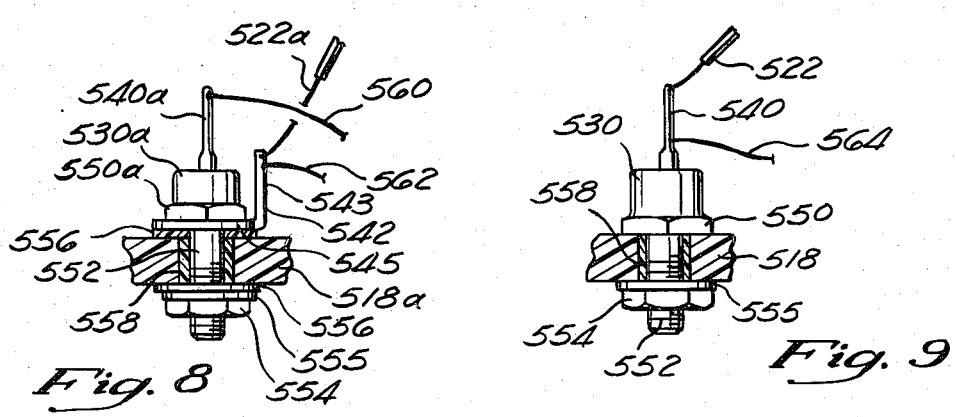
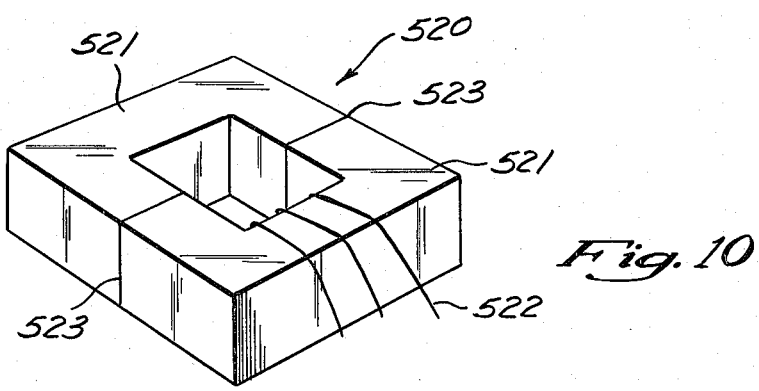

OUTPUT STAGE FOR SWITCHING REGULATED POWER SUPPLY

CROSS REFERENCE TO RELATED APPLICATION

This is a Continuation-in-Part of the copending application filed May 23, 1978, Ser. No. 908,563, and now U.S. Pat. No. 4,184,211.

BACKGROUND OF THE INVENTION

It has been well known in the art of power supplies for high speed computers to use a switching regulated power supply to convert power from a standard 110 volt alternating current to a precise low voltage, high direct current. Typically, such low voltages are 2 volts, 5 volts, 12 volts, or 15 volts, with currents ranging up to 200 amperes. As used in this specification, the term "switching regulated power supply" refers to that general class of power supplies in which an alternating current source at one frequency, typically 60 Hertz, is converted to a regulated alternating current source at a much higher frequency, typically 20,000 Hertz. This high frequency voltage is stepped down in an output stage and the output rectified to a smooth direct current at the lower voltage.

Switching regulated power supplies are generally used to supply the bias voltage for solid state logic elements in digital computers. Miniaturization of these logic elements and, in turn, of computers themselves, has long been a goal in the art of computer packaging. For this reason, the space restrictions for the associated power supplies have become increasingly stringent, creating a necessity for decreased size.

Furthermore, competition in the marketing of computers has created a need for computers with enhanced capabilities, requiring a greater number of logic elements. Such an increase in the number of logic elements increases the power required to run the computer. Thus, there is a tremendous demand in the computer industry for a power supply which can provide sufficient power to operate the increasingly large number of logic elements of the computer, while at the same time exhibiting qualities of compactness and miniaturization.

Unfortunately, power supplies of the prior art have typically been plagued by inefficient and reduced power output due to resistance losses caused by long or non-uniform distances of electrical path lengths within the power supply. In order to overcome these power losses, manufacturers of prior art power supplies have had to increase the physical size of such supplies, thereby directly contradicting the demand of the computer industry.

SUMMARY OF THE PRESENT INVENTION

These and other problems are alleviated by the output stage of the power supply of the present invention, which may have as much as 1,000 watts of output, but which is packaged in the same space as competitive power supplies that provide only 600 to 750 watts.

The features of the present power supply output stage are embodied in two preferred embodiments, each including a printed circuit board which mounts a transformer core having one multiple-turn, primary winding connected to a regulated high frequency signal source and plural single-turn, secondary windings connected to the diodes of a rectifier assembly. In both of the specific preferred embodiments described herein, eight single-turn, secondary windings are utilized, each comprised of U-shaped wires which are inverted over the periphery of the core of the transformer and proportionately spaced thereabout. The ends of these windings which extend down through the interior of the core are connected to conductive elements on the printed circuit board, while the ends of these secondary windings on the exterior of the core are each connected to one terminal of the eight diodes utilized in the rectifier assembly of the present output stage.

Specifically, the exterior ends of four of the secondary windings are connected to the anodes of four diodes which are mounted on a single heat sink such that their cathodes are in electrical communication with the heat sink. The exterior ends of the other four secondary windings are connected to the cathodes of the other four diodes which are mounted on a second heat sink such that their anodes are in electrical communication with it. These two heat sinks are mounted in parallel, coplanar relationships, thereby providing a mounting for the printed circuit board, which in turn mounts the transformer core.

Because four of the secondary windings are connected to the anodes of the four diodes with their cathodes electrically connected to one heat sink, and the other four secondary windings are connected to the cathodes of the four diodes having their anodes electrically connected to the other heat sink, the two heat sinks each have a sinusoidal, half wave rectified voltage which is 180° out of phase with the voltage of the other heat sink. Thus, by using one heat sink as the positive side of the power supply output and the other heat sink as the negative side of the power supply output, full wave rectification is achieved.

In the first embodiment of the present invention, four of the diodes of the rectifier assembly are forwardly mounted on a single heat sink while the other four diodes are reversely mounted on the other heat sink. That is, one set of diodes is mounted so that their anodes are exposed for electrical communication with the exterior ends of the U-shaped secondary windings while their cathodes are mounted in the heat sinks so as to make direct electrical contact therewith. Conversely, the other set of diodes is reversely positioned in the heat sink, having their cathodes exposed and their anodes directly mounted for electrical contact with the other heat sink. Furthermore, the exposed anode and cathode terminals of these eight diodes are connected to conductive elements on the printed circuit board and these conductive elements are, in turn, connected to the ends of the U-shaped secondary windings located exterior of the transformer core element.

In a second embodiment of the present invention, all eight diodes are forwardly mounted on the heat sinks such that their anodes are exposed for electrical connection to the exterior ends of the secondary windings of the transformer. These connections with the secondary windings are made directly, and not through conductive elements on the printed circuit board.

The dense packaging advantages of the present invention are exhibited in both embodiments thereof. The use of the two heat sinks, which are in close adjacent relationship to one another, as the positive and negative sides for the output stage, greatly facilitates the compact construction of the output stage, and minimizes the horizontal surface area it occupies. Furthermore, the vertical space occupied by the present output stage is minimized by the mounting of the transformer core on the printed circuit board which, in turn, is mounted on the heat sinks so as to conveniently interface with the rectifier diodes, also mounted on the heat sinks.

Another aspect of the present invention which is significant with respect to packaging and performance is the symmetrical positioning of the secondary windings and the diodes about the periphery of the transformer core. This arrangement also enables the output stage to have uniform electrical path lengths between the secondary windings and the heat sinks, thereby improving the efficiency and uniformity of the output signal generated by the present power supply.

A filter comprising a pair of series inductors and a pair of parallel capacitors is used to smooth the full wave rectified sinusoidal output of the power supply to a direct current. The power supply of both embodiments of this invention is also provided with capacitive snubbing devices to protect the rectifier system from sharp surges in voltage. The snubbing device consists in the first embodiment, of a resistor and a capacitor connected in series between the anodes of a diode mounted on one heat sink and the cathode of a diode mounted on the other heat sink. Because there are four forward mounted diodes having their cathodes connected to one heat sink and four reverse mounted diodes having their anodes connected to another heat sink in the power supply of this embodiment, there are four sets of snubbing devices connected in series between the four pairs of forward and reverse mounted diodes. In the second embodiment of the present invention, the snubbing circuit comprises a resistor and a capacitor connected in series with one another but connected in parallel with each of the eight diodes.

The filtering and snubbing systems of the present invention are also compactly packaged within the output stage. The capacitors of the filtering system are conveniently incorporated into a busing network, identical in both embodiments, which transmits the positive and negative output signals generated at the heat sinks to output terminals. Furthermore, the electronic components of both snubbing circuits are advantageously located on the printed circuit board and make contact with the diodes by means of the novel circuitry printed thereon.

Finally, the core of the transformer of either embodiment herein can be provided with multiple-turn secondary windings so as to increase the available power output of the present power supply. Two alternative constructions for the core are disclosed herein. In the first embodiment of the present invention, the core shown is a toroidal conductor while in the second embodiment the core is disclosed as two opposing U-shaped segments which are joined to form a square-shaped core.

Thus, in conclusion, the high density packaging method of this invention results in the novel and advantageous arrangement of the rececrtifier diodes about the periphery of the transformer core element which is vertically arranged together with the printed circuit board above the heat sinks upon which the diodes are mounted.

BRIEF DESCRIPTION OF THE DRAWINGS

FIG. 7 is a perspective view of the output stage of the second embodiment of the present invention, showing the transformer in exploded position;

FIG. 8 is a detailed, fragmentary view of the second embodiment showing the manner in which one set of diodes is mounted on one heat sink;

FIG. 9 is a detailed, fragmentary view illustrating the manner in which another set of diodes is mounted on the other heat sink in the second embodiment;

FIG. 10 is a perspective view of the core element utilized in the transformer of the second embodiment;

DETAILED DESCRIPTION OF THE FIRST EMBODIMENT OF FIGS. 1-6

1. Electrical Configuration and Operation

Figure 1:
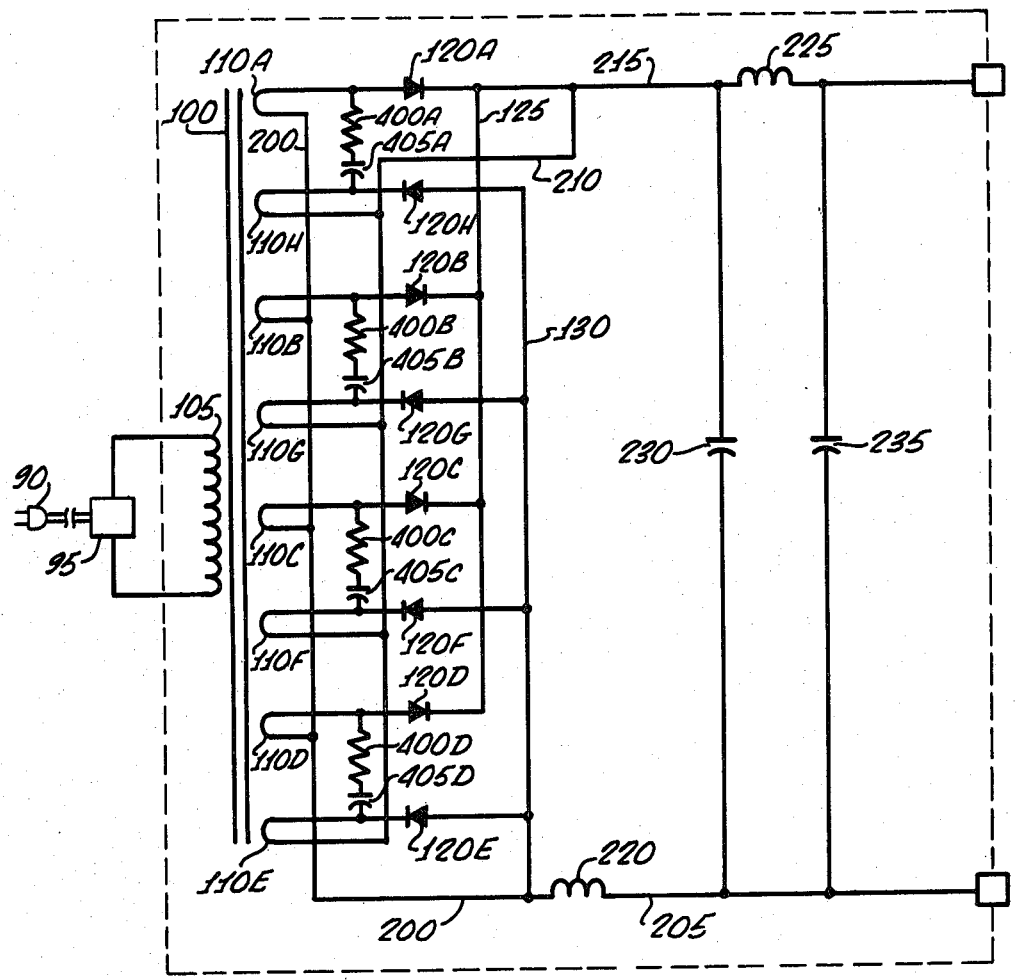
FIG. 1 is a schematic diagram of the circuit of an output stage for switching regulated power supply constructed in accordance with the first embodiment of this invention.

Referring to FIG. 1, there is shown a schematic diagram of the output stage of the present invention as utilized in a switching regulated power supply. Specifically, the schematic of FIG. 1 represents the first embodiment of the present output stage, with the second embodiment thereof differing only insofar as the snubbing circuitry is concerned.

A plug 90 is adapted to be connected to an alternating current source (not shown) having a frequency of 60 Hertz. A conventional switching and voltage regulating circuit 95 (of the type well-known in the art) converts this frequency to a regulated 20 kilohertz alternating current which then flows to a mulitple-turn primary winding 105 around a transformer core 100. The transformer core 100 has eight secondary windings 110A–110H each comprising of single-turn, U-shaped wires which are inverted and disposed over the core 100. (See FIG. 2) Thus, in FIG. 1, the upper side of the secondary windings 110A–110H represents that end of the secondary winding which lies exterior of the core 100, while the lower side of the winding represents the end which is disposed through the interior of the core.

The windings 110A–110D each have their upper ends connected to the anodes of diodes 120A–120D, respectively, which in turn have their cathodes connected to a conductive heat sink 125. Conversely, secondary windings 110E–110H have their upper ends connected to the cathodes of diodes 120E–120H, respectively, which have their anodes connected to a second conductive heat sink 130. The heat sinks 125 and 130 are respectively connected to a positive output bus bar 215 and a negative output bus bar 205, which, in turn, are electrically communicative with positive and negative terminals 206 and 207, respectively.

The secondary windings 110A–110D each have their lower or interior ends connected by means of a conductor 200 to the negative output bus bar 205. Similarly, secondary windings 110E-110H are connected at their lower ends to a conductor 210 which is in turn connected to the positive output bus bar 215.

Still referring to FIG. 1, a snubbing circuit is shown connected between the anode of each of the diodes 120A-120D mounted on heat sink 125 and the cathodes of each of the diodes 120E-120H which are mounted on heat sink 130. Thus, a resistor 400A and a capacitor 405A are connected in series between the anode of diode 120A and the cathode of diode 120H. A similar connection is made by resistor 400B and capacitor 405B between the diodes 120B and 120G, by the resistor 400C and the capacitor 405C between the diodes 120C and 120F, and by the resistor 400D and the capacitor 405D between the diodes 120D and 120E. In the second embodiment of the present output stage, eight snubber circuits, similarly comprised of a capacitor and resistor connected in series, are connected in parallel across each of the diodes of the rectifier assembly. The snubbing network of both embodiments is designed to protect the diodes 120A-120H from the harmful effects of sudden, sharp voltage spikes.

As shown in the schematic diagram of FIG. 1, a filtering system is also provided to smooth the direct current output of the present power supply. This filter network is comprised of an inductor 310 mounted in series on the negative output bus bar 205, inductor 325 mounted in series on the positive output bus bar 215, and capacitors 230 and 235 connected in parallel across the positive and negative bus bars 215 and 205. Furthermore, the inductive reactance of the elongate bus bars themselves and the capacitance between the two closely spaced heat sinks 125 and 130 further serve to smooth the direct current output and eliminate the ripples, noise, and transient voltage signals which could upset the operation and control of the logic elements of a computer into which the present power supply is installed.

The operation of the output stage of the present invention schematically shown in FIG. 1 can be described as follows:

120 volt, 60 Hertz alternating current is imposed at a constant voltage on the input plug 90. The switching and voltage regulating circuit 95 typically converts the line frequency of the input voltage from 60 Hertz to 20,000 Hertz. This 20,000 Hertz regulated alternating current is impressed upon the primary winding 105 of the transformer which causes, according to conventional transformer theory, a lower regulated voltage, typically 5 volts at 20,000 Hertz, to be induced on each of the secondary windings 110A-110H.

When the high frequency voltage applied to the primary winding 105 is positive, the upper or exterior ends of the secondary windings 110A-110H are at a positive potential with respect to the lower or interior ends. Therefore, diodes 120A-120D, being forwardly mounted on heat sink 125, will conduct while diodes 120E-120H, reversely mounted on heat sink 130, will be reversed biased and will not conduct. Thus, each of the secondary windings 110A-110D impress a positive voltage potential on the heat sink 125 with respect to the heat sink 130.

During this positive half cycle of the 20,000 Hertz input signal, a current flow path is provided from the exterior ends of secondary windings 110A-110D, through diodes 120A-120D, through heat sink 125, and through the postive output bus bar 215 to the positive output terminal 206. Current returns during this half cycle from the negative output terminal 207, through the negative output bus bar 205 to heat sink 130, and from there to the lower or interior ends of the windings 110A-110D through the conductor 200.

During the negative half cycle of the 20,000 Hertz input signal, the exterior ends of the secondary windings 110A-110D are at a negative potential with respect to their interior ends. Therefore, the diodes 120A-120D will not conduct whereas the diodes 120E-120H, being reversely mounted, will conduct, and the windings 110E-110H will impress a sinusoidal negative voltage wave form on the heat sink 130 through the diodes 120E-120H.

During this negative half cycle, a current flow path is provided from the interior ends of diodes 120E-120H to the heat sink 125 through the conductor 210. The positive output bus bar 215 then delivers the current to the positive output terminal 206. A return flow path is provided through negative output bus bar 205, through heat sink 130 and through diodes 120E-120H to the exterior ends of windings 110E-110H.

Thus, it can be seen that a full wave rectified positive potential is maintained between the heat sink 125 and the heat sink 130 during both the positive and negative half cycles of the 20,000 Hertz input voltage signal. Furthermore, in both embodiments of the present output stage, four of the secondary windings have their exterior ends attached to the anodes of four diodes mounted on one heat sink, while the other four secondary windings have their exterior ends attached to the cathodes of another group of four diodes mounted on the opposite heat sink. Therefore, with respect to the operation of the present output stage just described, the circuit schematic for both embodiments of the present invention is identical. However, the schematic of FIG. 1 differs for the second embodiment disclosed herein only in that a snubber circuit comprised of a series resistor/capacitor pair is connected in parallel with each diode of the rectifier assembly.

2. Mechanical Assembly

Figure 2:
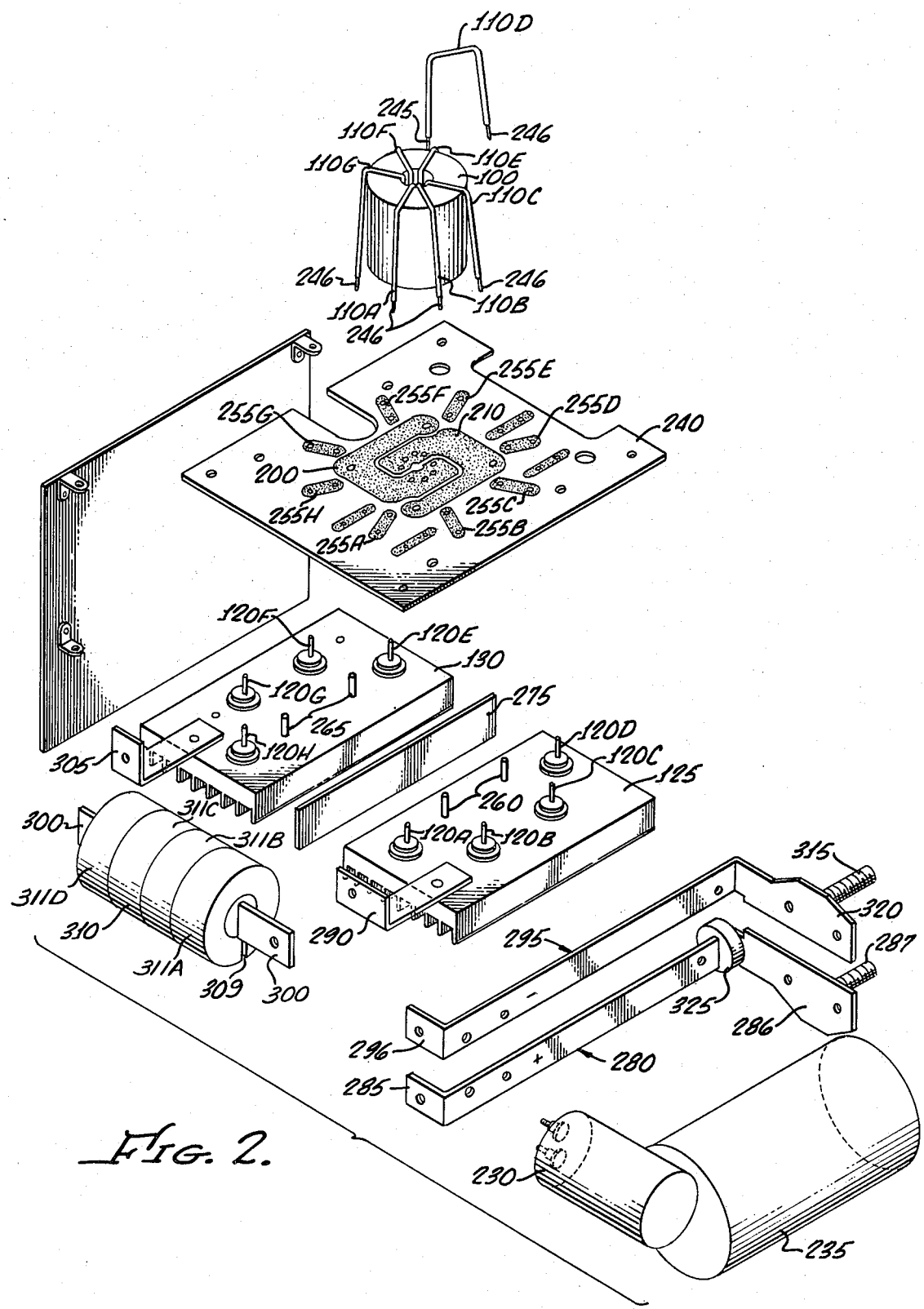
FIG. 2 is an exploded perspective view of the output stage of the first embodiment of the present power supply showing the packaging of its components.

Referring to FIG. 2, there is shown an exploded perspective view of the power supply output stage of the present invention. Not shown are the primary winding 105 nor the switching and voltage regulating circuit 95 shown in the schematic of FIG. 1.

Figure 5:
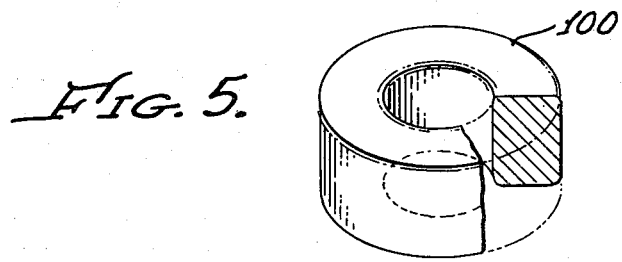
FIG. 5 is a perspective and partial cross-sectional view of the toroidal transformer core element of the first embodiment.

A toroidal transformer core 100 is shown with eight single-turned secondary windings 110A-110H uniformly spaced about its periphery. The rectangular cross-section of the core 100 is shown in more detail in FIG. 5. Each of the secondary windings 110A-110H comprises an essentially U-shaped wire which is inverted and placed over the core 100 so that one end of the wire extends down through the interior of the core, while the other end of the winding is exteriorly disposed of the core. Thus, for example, the interior end 245 of the secondary winding 110D extends through the central opening in the core while the exterior ends 246 of the secondary windings 110A-110H are shown on the exterior of the core 100.

The transformer core 100 is mounted on the central portion of a printed circuit board 240 so that the interior ends 245 of the secondary windings 110A-110H make electrical contact with two conductive elements 200 and 210 printed on the circuit board. Specifically, the interior ends 245 of secondary windings 110A-110D are connected to conductive element 200, while the interior ends of windings 110E-110H are connected to conductive element 210. The exterior ends 246 of the secondary windings 110A-110H are connected to one of two contact positions provided by each of eight conductive strips 255A-255H.

As shown in FIG. 2, eight diodes 120A-120H are mounted on heat sinks 125 and 130 in a circular configuration so as to be concentric with and exterior of the circle formed by the exterior ends 246 of the secondary windings 110A-110H.

The printed circuit board 240 is in turn mounted upon the two heat sinks 125 and 130 so that one terminal of each of the diodes 120A-120H is connected to the contact position in each of the conductive strips 255A-255H not occupied by the exterior ends 246. The diodes 120A-120D are forwardly mounted in heat sink 125 so that their anodes make contact with the conductive strips 255A-255D while their cathodes are electrically connected to the heat sink 125 by virtue of their being mounted therein. On the other hand, the diodes 120E-120H are reversely mounted in heat sink 130 so that their cathodes are in contact with the conductor strips 255E-255H, respectively, and their anodes are in electrical contact with heat sink 130 by virtue of their mounting therein. Thus, by means of the conductive strip 255A-255H, the exterior ends 246 of the secondary windings 110A-110D are connected to the anodes of diodes 120A-120D while the exterior ends of secondary windings 110E-110H are connected to the cathodes of diodes 120E-120H.

The heat sinks 125 and 130 are coplanar and in close adjacent relationship with one another, separated only by a thin insulative strip 275. As shown in FIG. 2, the heat sinks 125 and 130 have solid rectangular configurations with planar top surfaces upon which the diodes 120A-120H are mounted and bottom surfaces having a plurality of heat dissipation fins extending along the entire length of the heat sinks. The heat sink 125 is electrically connected by two vertical cylindrical conductors 260 to the conductor 210 on the printed circuit board 240. Similarly, the heat sink 130 has two cylindrical conductors 265 which extend from the surface of the heat sink 130 facing the printed circuit board and which are connected to the conductor 200 on the circuit board 24.

These cylindrical conductors 260 and 265, together with the printed conductors 200 and 210 serve to connect the interior ends 245 of the secondary windings to the heat sinks 125 and 130. Thus, during the positive half cycle of the operation of the present output stage, the return current flow is from the heat sink 130, through the cylindrical conductors 265 to the conductive element 200, and from there to the interior ends 245 of the secondary windings 110A-110D. During the negative half cycle, the current flow is from the interior ends 245 of the secondary windings 110E-110H and from there to the heat sink 125 by means of the conductive element 210 and the cylindrical conductors 260.

Referring again to FIG. 2, a positive bus bar 280 attaches at one end 285 to a positive bus bar bracket 290 which is, in turn, attached to the heat sink 125. From the end face 285, the positive bus bar 280 extends along the entire length of the heat sink 125 to the opposite end face 286, where it is attached to a bolt 287 which forms the positive output terminal for the output stage of the present invention. A negative bus bar 295 is connected at one end 296 to one end of another negative bus bar 300 which is connected at its opposite end to a negative bus bar bracket 305 which, in turn, is electrically attached to heat sink 130. A negative output terminal 315 is attached to the end face 320 of the negative bus bar 295. The bus bars 280 and 295, the bus bar brackets 290 and 305, and the negative bus bar 300 are preferably formed of highly conductive metal such as aluminum and have a large enough cross-section to provide a very low resistance to the electric current.

The end faces 286 and 320 of the positive bus bar 280 and negative bus bar 295, respectively, also advantageously mount the electrolytic capacitor 235. This capacitor 235, which is connected across the output terminals 287 and 315, typically has a capacitance of 47,000 microfarads, making it sufficiently large to store enough charge to maintain the output voltage of the output stage for an interval of time, typically 50 milliseconds, in case of momentary failure of AC power. The electrolytic capacitor 230 which is typically rated at 19,000 microfarads, is mounted on the positive and negative bus bars 280 and 295, respectively, near their respective end faces 285 and 296.

A large inductor 310 having a toroidal configuration is mounted on the negative bus bar 300. This inductor 310 is comprised of four individual ferromagnetic cores 311A, 311B, 311C and 311D, each having an aligned air gap 309. As shown in FIG. 2, the air gap 309 extends through only the lower portion of the cores 311A-311D and is useful in preventing magnetic saturation of the inductor 310 as well as in mounting the inductor 310 on the negative bus bar 300. In an alternative configuration of this inductor (not shown), the air gap 309 extends completely through both the upper and lower portions of the inductor cores 311A-311D, further alleviating the saturation problem. That is, each core 311 is comprised of two opposing C-shaped sections or opposing U-shaped sections.

A smaller inductor 325 is mounted on the positive bus bar 289 adjacent and bonded to the end face 286. This smaller inductor 325 is also preferably formed of ferromagnetic material shaped in a cylindrical disk configuration with its axis parallel to the longitudinal dimension of the positive bus bar 280.

As described above in connection with FIG. 1, the capacitors 230 and 235 and the inductors 310 and 235 form a filtering network to smooth the direct current output of the output stage of the present invention, minimizing electrical noise to about 50 millivolts, peak to peak value. These essential components are compactly packaged in the present output stage by being incorporated in the bus bars and bus bar brackets which interconnect the heat sinks 125 and 130 with their respective output terminals 287 and 315. Furthermore, this filtering network, and the bus bar system upon which it is mounted, is totally compatible with the output stage of the second embodiment of the present invention, hereinafter described.

3. Printed Circuit Board Configuration

Figure 3:
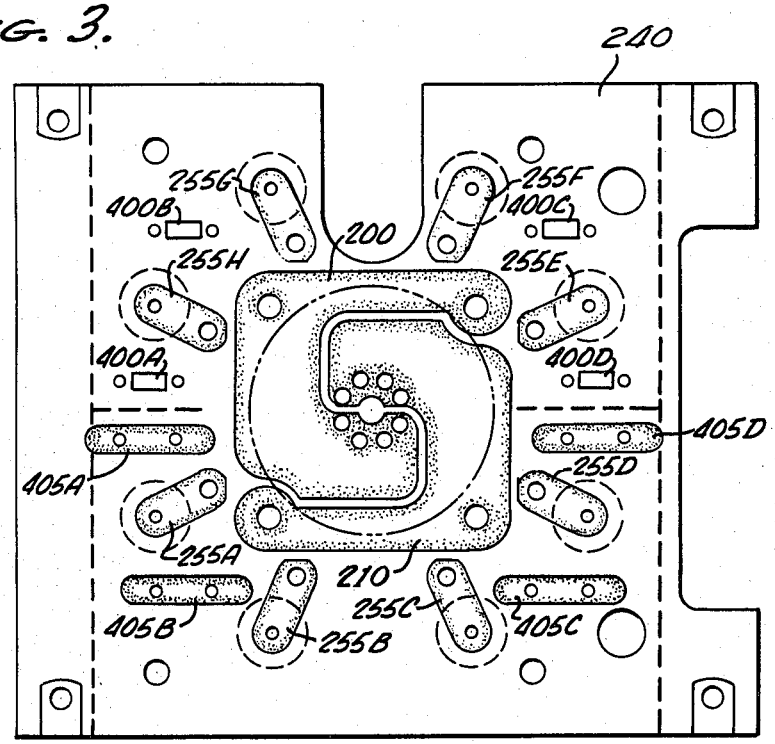
FIG. 3 is a top plan view of the printed circuit board of the first embodiment shown in FIG. 2.
Figure 4:
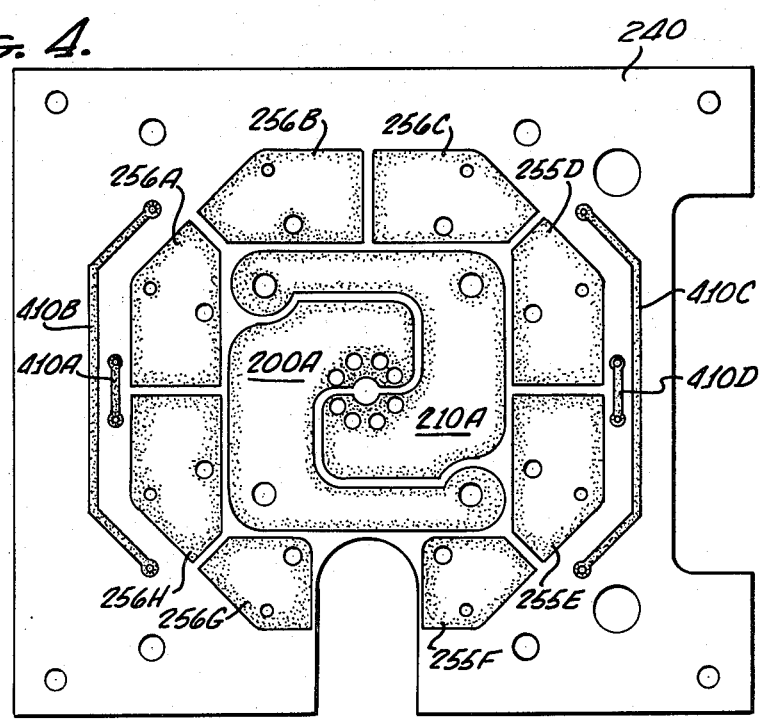
FIG. 4 is a bottom plan view of the printed circuit board of FIG. 2.

Referring to FIGS. 3 and 4, there are shown the top and bottom plan views, respectively, of the printed circuit board 240 of FIG. 2. In the central portion of FIG. 3, the conductive elements 200 and 210 are shown, with their opposite sides 200A and 210A, respectively, shown in FIG. 4. Conductive strips 255A-255H are proportionately positioned on the printed circuit board 240 about the conduct elements 200 and 210, as shown in FIG. 3, and extend radially from their center. The conductors 256A-256H, shown in FIG. 4 on the bottom surface of the printed circuit board 240, are each respectively connected to the conductive strips 255A-255H. As described in connection with FIG. 2, these conductors 255 and 256 provide for electrical connection between the exterior ends 246 of the secondary windings 110A-110H and the diodes 120A-120H.

The printed circuit board 240 shown in FIGS. 3 and 4 also provides a mounting for the components of the snubbing network described in connection with FIG. 1. Each snubbing circuit comprises a resistor 400 and a capacitor 405 connected in series with one another and also in series with the anode of one of the diodes 120A-120D and the cathode of one of the diodes 120E-120H. Thus, a resistor 400A and a capacitor 405A are mounted on the areas indicated in FIG. 3 and are connected together in series by a conductive strip 410A, shown in FIG. 4. One terminal of the resistor 400A is attached to the cathode of diode 120H (shown in dotted lines in FIG. 3) by means of the conductors 255H and 256H, shown in FIGS. 3 and 4, respectively. Similarly, one terminal of the capacitor 405A is connected to the anode of diode of 120A (shown in dotted lines in FIG. 3) by means of conductors 255A and 256A.

A snubbing circuit comprised of resistor 400B, is connected between the cathode of diode 120G and the anode of diode 120B by means of conductors 255G and 256G and conductors 255B and 256B, respectively. Resistor 400C is connected in series with capacitor 405C by conductive strip 410C, and this resistor/capacitor pair connects the cathode of diode 120F and anode of diode 120C by means of conductors 255F and 256F and conductors 255C and 256C, respectively. Finally, resistor 400D is connected to capacitor 405D by means of conductive strip 410D, forming a snubbing circuit which is connected between the cathode of diode 120E and the anode of diode 120D by means of conductors 255E and 256E and conductors 255D and 256D, respectively.

Thus, these four snubbing networks, each comprising a resistor/capacitor pair connected in series, prevents the leakage reactance produced by the transformer from inducing high voltage spikes on the rectifier diodes 120A-120H.

DETAILED DESCRIPTION OF THE SECOND EMBODIMENT OF FIGS. 7-12

1. Mechanical Assembly and Packaging

Referring to FIGS. 7-12, there is shown a second embodiment of the present invention which also provides the dense packaging advantages thereof. Referring initially to FIG. 7, there is shown the output stage 510 of the second embodiment which consists of a rectifier assembly 512 and a transformer 514, shown in an exploded position above the rectifier assembly 512.

The rectifier assembly 512 includes a printed circuit board 516 mounted on two coplanar, rectangular heat sinks 518 arranged in close adjacent relationship to one another. The transformer 514 comprises of a square-shaped core 520 wrapped with primary windings (not shown) and eight single-turn secondary windings 522. The core 520, which is also square in cross-section is comprised of two opposing U-shaped sections 521 which are joined at their interfaces. The windings 522 are also U-shaped and inverted over the core 520 and spaced proportionately about its periphery. One end of each winding 522 extends down through the interior of core 521 while the other end, as shown in FIG. 7, drapes over the exterior of the core 520.

The printed circuit board 516 of the rectifier assembly 512 is mounted on and spaced above the heat sinks 518 by means of four screws 524 and four spacers 526 (only two of which are visible in FIG. 7), which are located approximately in the four corners of the printed circuit board 516. Heat sinks 518 and 518a are rectangular in shape and have plural fins extending along the entire length of their bottom surface. The two longitudinal sides of the heat sinks 518 are adjacent one another and separated only by a thin insulative strip 528. As in the first embodiment, one heat sink 518 acts as a positive terminal for the output stage 510 of the present invention, while the other heat sink 518a is the negative terminal.

Still referring to FIG. 7, the printed circuit board 516 has seven openings to accommodate the eight diodes 530 which are mounted on the heat sinks 518, with one large oblong shaped opening receiving two diodes and thermal switch 538. The diodes 530 are spaced uniformly around the periphery of two conductive elements 532 and 532a, printed on the center of the printed circuit board 516. These conductive elements 532 are generally U-shaped and inverted with respect to each other so that the vertical side of one interlocks the vertical side of the other. Furthermore, these conductors 532 and 532a of this embodiment are electrically connected to heat sinks 518 and 518a, respectively, by means of metallic screws 534 and 534a, respectively.

As shown in FIG. 7, eight contact locations 536 and 536a are arranged in a circle on conductive elements 532 and 532a, four locations 536 being positioned on conductor 432a and four locations 536a on conductors 532. These contact locations 536 provide for the attachment of the interior ends of the secondary windings 522 to the conductive elements 532. Thus, the U-shaped arrangement of the conductive elements 532 allows the interior ends of the secondary windings 522 to be electrically connected to heat sink 518a. Conversely, the interior ends of secondary windings 522a are in electrical connection with heat sink 518. Both of these electrical connections are made possible through conductive screws 534a and 534, respectively.

Conductive element 532a is also provided with contact locations for electrical wires 560 which connect the anodes 540a of the diodes 530a to the conductive element 532a. Furthermore, both of the conductive elements 532 and 532a are provided with contact locations (not shown in FIG. 7) for one of the terminals of the capacitors of the snubber circuits, which in the second embodiment are connected in parallel with each of the diodes 530. These aspects of the present invention will be discussed in more detail below.

The eight diodes 530 and 530a of this second embodiment are all forwardly mounted on the heat sinks 518 and 518a, respectively. Thus, referring to FIG. 7, the needle-like anodes 540 and 540a of the diodes 530 and 530a extend upward while the cathodes (not shown) are adjacent the heat sinks 518. Lugs 542 connect the exterior ends of secondary windings 522a to the cathodes of one set of diodes 530a. Anodes 540a of diodes 530a are in electrical communication with heat sink 513 by means of wires 560, conductor 532a, and conductive screws 534a.

In view of these electrical connections of the diode terminals, the diodes 530a are physically mounted in heat sink 518a so as to be electrically insulated from it. The diodes 530, on the other hand, are mounted in heat sink 518 so that their cathodes (not shown) make electrical contact with said heat sink. Also, the exterior ends of secondary windings 522 are directly wired to the anodes 540 of diodes 530. The precise manner in which the diodes 530 and 530a are mounted in the heat sinks 518 will be described below in connection with FIGS. 8 and 9.

FIG. 7 also depicts eight resistors 544 and eight capacitors 546 located on the printed circuit board 516 about the periphery of conductive elements 532 and adjacent the diodes 530. The resistors 544 are cylindrical and stand upright on the printed circuit board 516, while the capacitors 546, also essentially cylindrical in shape, lie horizontally thereon. Each resistor and capacitor pair form a snubber circuit which is connected in parallel with each of the diodes 530 and 530a.

One set of resistors 544 is shown electrically wired to the anodes 540 of the diodes 530. Electrical connection between each of these resistors and their respective capacitors 546, and from there to the cathode of diodes 530, is made through circuitry on the printed circuit board 516 and the conductive screws 534. Another set of resistors 544, on the other hand, is electrically wired to the lugs 542 so as to be in communication with the cathodes of diodes 530a. Electrical communication between each of these resistors and their respective capacitors 546 and from there to the anodes 540a of the diodes 530a, is made through the printed circuit board 516 and the wires 560. The manner in which these electrical connections through the printed circuit board are made will be described below in more detail in connection with FIGS. 11 and 12.

Also shown in FIG. 7 is a cylindrical thermal switch 538 which is positioned between two of the diodes 530. The switch 538 is mounted on the heat sink 518 and extends through the same oblong-shaped opening in the printed circuit board 516 as the two adjacent diodes 530. The switch 538 is sensitive to the temperature level on the heat sink 518 and provides a warning signal which cuts off the electrical signal to the output stage 510 in the event that the temperature exceeds a safe maximum.

FIGS. 8 and 9 depict in detail the manner in which the diodes 530 are mounted on the heat sinks 518. In FIG. 8, diode 530a is shown mounted through an opening in the heat sink 518a. Each diode 530a includes a vertical anode 540a and a cathode 550a which consists of a hexagonal nut. A bolt 552 extends vertically down from the cathode 550a and is threaded at the opposite end to receive a nut 554 and a flat washer 555 to mount the diode 530a on the heat sink 518a.

A metal lug 542 is shown attached to the cathode 550a of the diode 530a. It consists of a horizontal annular portion 543 which is in contact with the bottom of the cathode 550a and a vertical portion 545 which is attached to the periphery of the horizontal portion 543. The diode 530a and lug 542 are completely insulated from the heat sink 518a by means of two washers 556 disposed respectively between the lug 542 and the upper surface of the heat sink 518a, and between the washer 555 and the lower surface of the heat sink. Furthermore, the bolt 552 is insulated from the interior walls of the opening in the heat sink 518a by means of a rubber bushing 558. In spite of this electrical insulation between the diodes 530a and the heat sink 518a, the amount of heat transferred from the diodes to the heat sink is sufficient to maintain the proper operation of the output stage of this embodiment. Moreover, the washers 556 are constructed from mica in this embodiment, rather than some other electrically insulative materials, because of mica's superior heat transfer properties.

FIG. 8 also illustrates the various electrical wires which are attached to the diode 530a. Wire 560 is soldered at one end to the anote 540a of the diode and is connected at its opposite end to the conductive element 532a, as discussed above. The exterior end of the secondary winding 522a is soldered to the lug 542 so as to make contact with the cathode 550a. Similarly, a wire 562 is attached to the cathode and to one terminal of a resistor 544, shown in FIG. 7, which forms part of the snubber circuit for each said diode 530a.

Diode 530, shown in FIG. 9, is of identical construction to the diode 530a just described in connection with FIG. 8. It consists of a vertical anode 540, a hexagonal cathode 550, and a threaded bolt 552. The diode 530 is also similarly assembled to the heat sink 518 by inserting the bolt 552 through an opening in the heat sink and utilizing the cathode 550, a flat washer 555, and the nut 554 to secure the diode to the heat sink. The cathode 550 is in electrical communication with the heat sink 518 since no insulative washers 556 are utilized in the mounting of the diodes 530. However, a bushing 558 is utilized in mounting these diodes only to eliminate any slack between the bolt 552 and the opening in the heat sink. The exterior end of the secondary winding 522 is connected directly to the anode 540 of the diode 530, and a wire 564 connects the anode 540 to a resistor 544, shown in FIG. 7.

The current flow through the output stage of this second embodiment of the present invention can be described as follows. During the positive half cycle of the input signal, the current flow is through the exterior ends of the secondary windings 522, through diodes 530, into heat sink 518 and out to the positive output terminal through the busing system (not shown). A return current flow to the interior ends of secondary windings 522 is provided through heat sink 518a, conductive screws 534a, and conductive element 532a where contact locations 536 are in communication with the interior ends of secondary windings 522.

During the negative half cycle of the input voltage, current flow is into the interior ends of secondary windings 522a and into positive heat sink 518 through contact locations 536a, conductive element 532, and conductive screws 534. The return current path from the load to the interior ends of the secondary windings 522a is through the negative heat sink 518a, conductive screw 534a, wire 560 through diode 530a and from there to the secondary winding 522a by means of lug 542. Since current flow through diodes 530a is out through lug 542, the need for insulating these diodes from the heat sink becomes apparent.

As shown in FIG. 10, core 520 of the transformer 514 is comprised of two U-shaped sections 521 which face one another and are joined at interfaces 523. Before mounting the core 520 on the circuit board 516, a voltage barrier consisting of an insulative paper (not shown) is first placed over the conductive elements 532 on the circuit board in order to insulate the core from the circuitry on the board.

This construction of the core 520 provides a definite advantage in the efficiency of the operation of the transformer 514 of the present invention. The interfaces 523 between the U-shaped segments 521 produce an unavoidable air gap in the magnetic field which flows about the core 520. Thus, during each half cycle of the input signal, the core 520 is less apt to become saturated with magnetic flux, thereby significantly reducing the effects of residual magnetism. This configuration of the core 520 can also be utilized, as mentioned above, for the four cores 311A-311D of the inductor 310 of the first embodiment. Finally, as shown in FIG. 10, the secondary windings 522 of the transformer 514 may comprise two or three turns about the core 520 in order to produce a higher output voltage for the output stage 510 of the present invention.

This alternate output stage of the power supply of the present invention is totally compatible with the output bus bars and filtering assemblies described above in connection with the first embodiment. Furthermore, all reverse-mounted diodes could be used in the present output stage with the simple result that the polarity of the heat sinks 518 would be reversed.

2. Printed Circuit Board Configuration

Figure 11:
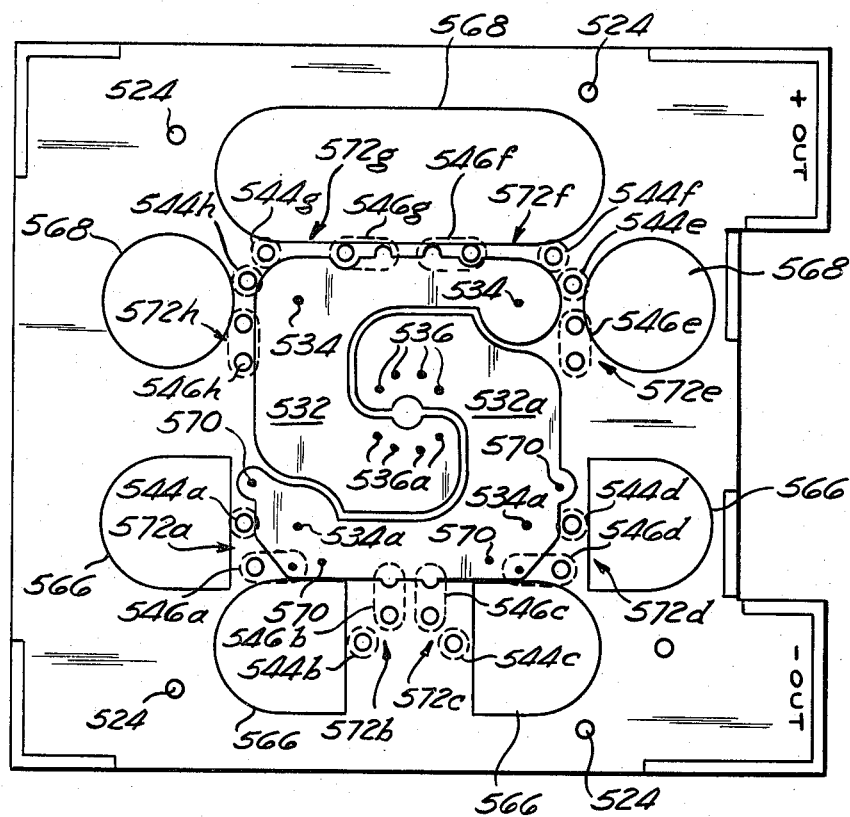
FIG. 11 is a top plan view of the circuit board of the second embodiment of the present invention.
Figure 12:
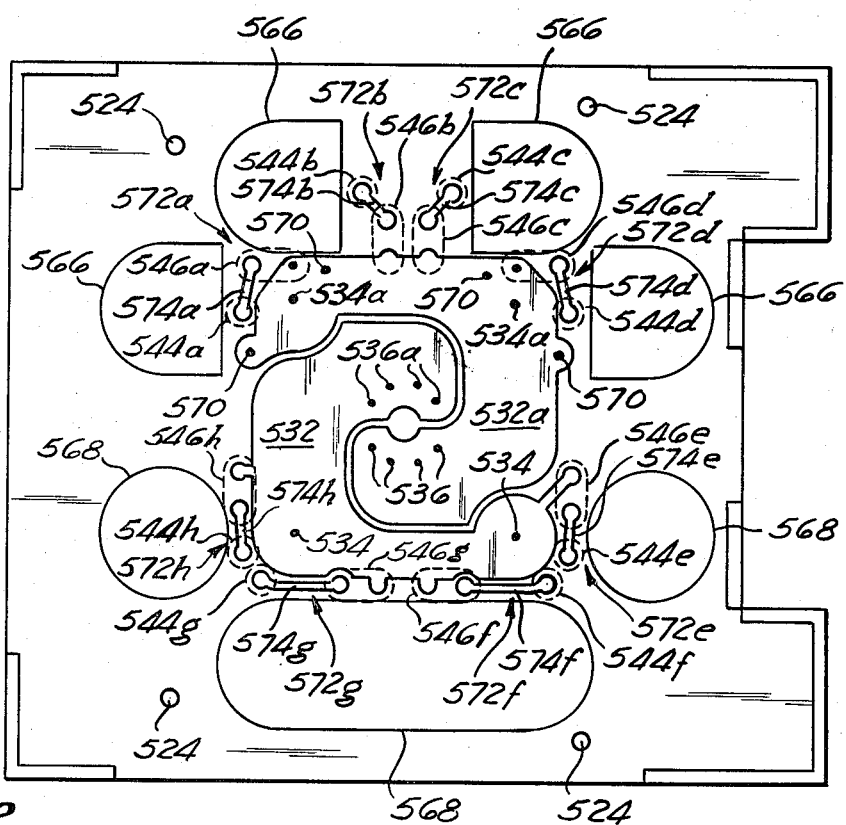
FIG. 12 is a bottom plan view of the circuit board of FIG. 10.

FIGS. 11 and 12 illustrate the top and bottom surfaces, respectively, of the printed circuit board 516. It should be noted that the upper portion of FIG. 11 and the lower portion of FIG. 12 represent the left hand portion of the printed circuit board 516, as oriented in FIG. 7. Shown near the corners of the printed circuit board 516 are locations for the screws 524 which, in conjunction with spacers 526, are utilized in mounting the printed circuit board 516 above the heat sinks 518.

Referring to FIGS. 11 and 12, there are shown openings 566 and 568 which are cut out of the printed circuit board 516 to allow the passage of diodes 530 and 530a. Openings 566 accommodate diodes 530a are therefore straight on one side in order to allow the vertical stem of lug 542 to extend upwardly. The four diodes 530 extend through the three openings 568, two of which are circular and the third being oblong-shaped to accommodate two of the diodes 530 and the thermal switch 538.

The openings 566 and 568 are positioned around the periphery of the two conductive elements 532 and 532a printed on the printed circuit board 516. Arranged in a circular pattern near the center of the printed circuit board 516 are the contact locations 536 and 536a which receive the interior ends of the secondary windings 522 and 522a. Near the four corners of the square pattern formed by the two conductive elements 532 and 532a are the locations where the screws 534 and 534a extend down through the circuit board 516 and into the heat sinks 518 and 518a, respectively. Located on conductive element 532a are four locations 570 where the wires 560 connect the anodes 540a of the diodes 530a to the conductive element 532a, as shown in FIGS. 7 and 8.

Eight snubber circuits 572a-572h are clustered around the periphery of the conductive elements 532 and 532a. Generally, each snubber circuit 572 consists of a resistor 544 in series with a capacitor 546, which in turn are connected in parallel with each of the diodes 530. Thus, each of the snubber circuits 572a-572d are connected in parallel with diodes 530a while each of the snubber circuits 572e-572h are associated with diodes 530.

Since each of the resistors 544a-544h are mounted vertically on the printed circuit board 516, their positions are represented by a dotted circle, as shown in FIGS. 11 and 12. One terminal of the resistor 544 is attached to the printed circuit board 516 at the contact location within each of the dotted circles. In the cases of each of the resistors 544a-544d, the opposite terminal is wired to the cathode 550a of one of the diodes 530a by means of wire 562 and lug 542, as shown in FIGS. 7 and 8. In the case of resistors 544e-544h, the opposite terminal is wired to the anodes 540 of diodes 530 by means of wire 564, as shown in FIGS. 7 and 9.

The capacitors 546, being essentially cylindrical in shape and mounted horizontally on the printed circuit board 516, are represented as cylindrical dotted lines in FIGS. 11 and 12. In addition, the contact locations for both of the terminals of the capacitors 546 are shown within the dotted lines in those figures. Each of the resistors 544 and capacitors 546 are connected in series to one another by short printed conductors 574a-574h, which are shown in FIG. 12. One terminal of each of the capacitors 546 is in turn connected to the appropriate conductive element 572, as shown in FIGS. 11 and 12.

Snubber circuit 572a is connected in parallel to one of the diodes 530a by connecting one terminal of the resistor 544a to the cathode 550a of the diode and by connecting one terminal of the capacitor 546a to the anode 540a of the diode. In the case of the resistor 544a, the connection with the cathode 550a is made by means of the wire 562 and the lug 542, as shown in FIGS. 7 and 8. In the case of the capacitor 546a, the connection with the anode 540a is made through the conductive element 532a and the wire 560, as shown in FIGS. 8, 11 and 12. Similarly, each of the snubber circuit 572b-572d are connected in parallel to the remaining diodes 530a by connecting one terminal of each of the resistors 544b-544d to the appropriate cathode 550a by means of a wire 562 and a lug 542, and by connecting one terminal of each of the capacitors 546b-546d to the appropriate anode 540a by means of the conductive element 532a and a wire 560.

Snubber circuit 572e is connected in parallel to one of the diodes 530 by connecting one terminal of the resistor 544e to the anode 540 and by connecting one terminal of the capacitor 546e to the cathode 550. In the case of resistor 544e, the connection with the anode 540 is made by means of a wire 564, as shown in FIG. 9. With respect to the capacitor 546e, the connection with the cathode 550 is made through the conductive element 532, screws 534, and heat sink 518, as shown in FIGS. 9, 11 and 12. Similarly, snubber circuits 572f-572h are connected in parallel, with the remaining diodes 530 by connecting one terminal of each of the resistors 544f-544h to the appropriate anode 540 by means of a wire 564, and by connecting one terminal of each of the capacitors 546f-546h to the appropriate cathode by means of the conductive element 532, screws 534, and heat sink 518. As discussed above, the function of these snubbing circuits 572 is to protect the diodes 530 from sudden, strong voltage impulses.

Description of the Packaging Advantages of the Present Invention

Figure 6:
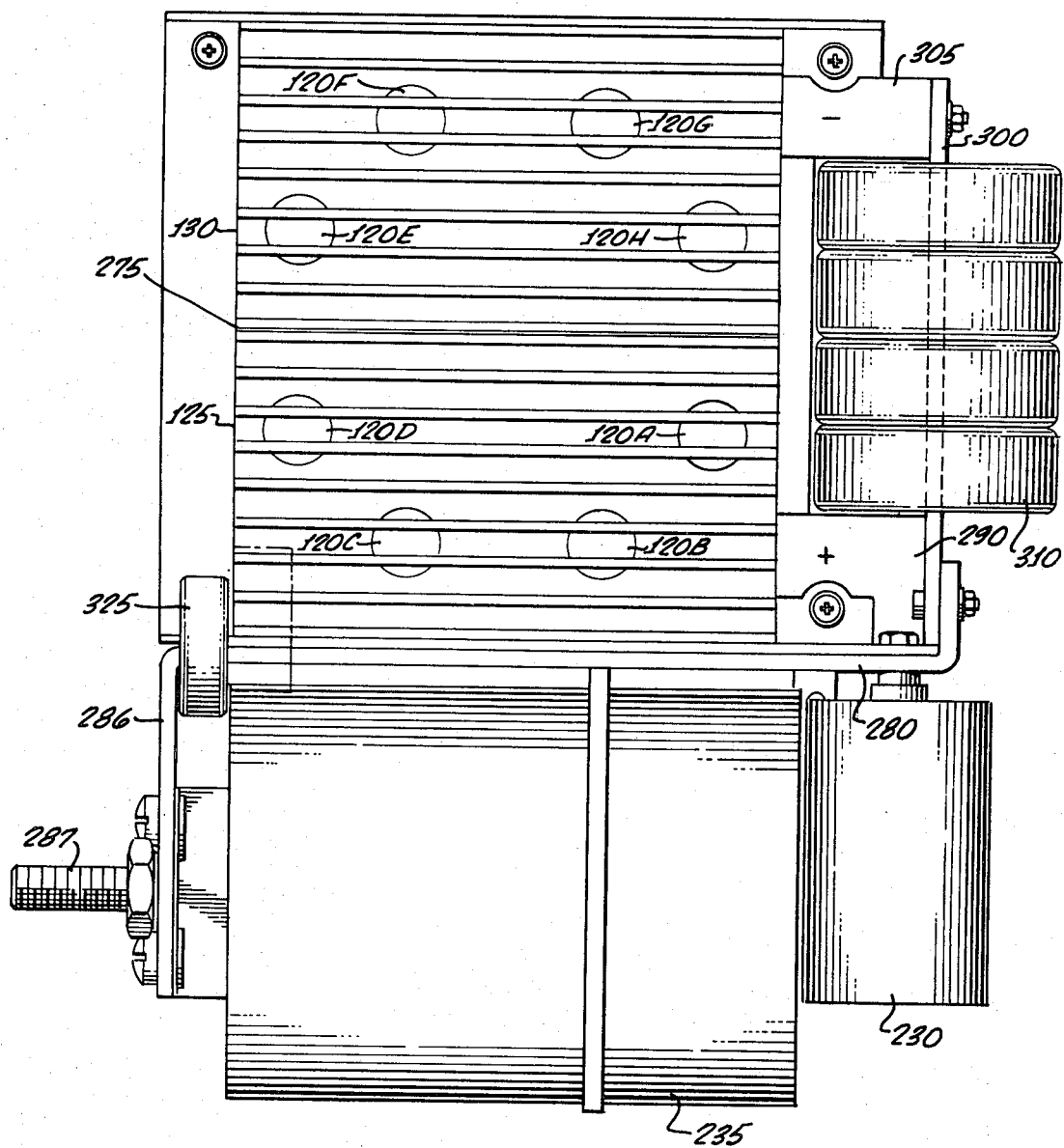
FIG. 6 is a bottom plan view of the power supply of the first embodiment fully assembled.

The dense packaging advantages of both embodiments of the present output stage are apparent by reference to FIGS. 2, 6 and 7. A very important feature of the present invention in this regard is the convenient use of the heat sinks as preliminary output terminals. This enables the heat sinks to perform several functions: they provide a mounting for the rectifier diodes, they dissipate the heat which is concentrated in these diodes during the operation of the output stage, and they serve as output terminals. This versatility eliminates the need for additional structure and allows the present output stage to be as compact as possible.

Furthermore, as described above, the busing network of the present output stage, which connects the heat sinks to their respective output terminals, conveniently and advantageously incorporates and provides a mounting for the filtering system, thereby eliminating the need for additional structure and circuitry. Finally, as well illustrated in FIG. 6, the close positioning of the heat sinks with respect to one another and with respect to the bushing and filtering systems, enables the present output stage to occupy only a minimal amount of horizontal surface area.

In addition to the functions listed above, the heat sinks also conveniently mount the printed circuit board, which in turn mounts the transformer core. This stacking arrangement enables the present output stage to minimize the amount of vertical space it occupies, as best illustrated in FIG. 7. The vertical density of the second embodiment shown in FIG. 7 is further enhanced by the diode openings 566 and 568, in the printed circuit board 516, which permit the printed circuit board to lie very close to the heat sinks 518 and 518a.

Besides the vertical packaging advantages obtained by mounting the transformer core directly on the printed circuit board, this configuration also enhances the quality of the operation of the present output stage. That is, the shorter path lengths of the single turn secondary windings of the transformer core provide an output stage with lower power loss due to electrical resistance. The short conductor paths also provide for the more efficient operation of the snubbing network, which prevents harmful voltage spikes on the diodes. Moreover, the symmetrical arrangement of the diodes about the periphery of the transformer core ensures uniform path lengths and decreased electrical noise.

Thus, a power supply constructed in accordance with this invention can supply up to 1,000 watts of power, but is packaged in the same space as competitive power supplies which provide only 600 to 750 watts. As merely one example of the compactness of the present invention, the overall dimensions of an output stage constructed according to the above-described principals are about $5\frac{1}{4}$ inches long by $4\frac{1}{4}$ inches wide by $2\frac{1}{4}$ inches high. However, these packaging principals can be employed to construct various different output stages of similarly compact dimensions.

What is claimed is:

1. An output stage for a switching regulated power supply comprising:
    two parallel coplanar heat sinks in close adjacent relation with one another, each said heat sink having plural fins for the dissipation of heat;
    a first and second set of diodes respectively mounted on and in electrical communication with said heat sink;
    a printed circuit board disposed above said heat sinks having two conductors printed thereon, each said conductor in electrical communication with one of said heat sinks;
    a ferromagnetic core mounted on said printed circuit board having primary winding;
    first and second sets of single turn, secondary windings on said core, each said winding comprised of a generally U-shaped wire disposed over said core so that one end of said winding extends through the interior of said core while the other end is disposed exterior of said core, said interior end and said exterior end of each secondary winding respectively connected to the terminals of one of said diodes;
    said exterior end of said first set of windings connected to one terminal of said first set of diodes and said exterior end of said second set of windings attached to the opposite terminal of said second set of diodes; and
    said interior end of said first set of windings connected by means of one of said printed conductors to the other terminal of said second set of diodes and said interior end of said second set of windings connected by means of the other printed conductor to the other terminal of said first set of diodes.

2. The output stage of claim 1 wherein the diodes of said first set of diodes have a physical orientation relative to said heat sinks which is opposite that of said second set of diodes.

3. The output stage of claim 1 wherein all diodes are uniformly physically oriented relative to said heat sinks.

4. A compact, densely packaged full wave rectifier, comprising:
    two heat sinks in close adjacent relation with one another, each said heat sink having a set of diodes mounted thereon;
    a printed circuit board disposed adjacent said heat sinks; and
    a transformer core mounted on said printed circuit board having a primary winding and plural secondary windings, each said secondary winding connected to one of said diodes such that during each half cycle of the non-rectified signal, one said set of diodes is conducting while the other said set of diodes is not conducting.

5. The full wave rectifier of claim 4 wherein said heat sinks are in physical and electrical contact with one terminal of said diodes and have opposite polarity with respect to one another.

6. The full wave rectifier of claim 5 wherein said printed circuit board further comprises means for making said electrical connection between said secondary windings and said diodes.

7. The full wave rectifier of claim 4 wherein only one said set of diodes is in electrical contact with said heat sinks by virtue of their physical mounting thereon.

8. The full wave rectifier of claim 7 wherein the other said set of diodes is mounted on said heat sink so as to be electrically insulated therefrom, substantially all heat generated in said insulated diodes being transferred to said heat sink.

9. The full wave rectifier of claim 8 wherein all of said diodes have their anodes and cathodes uniformly oriented relative to said heat sinks.

10. The full wave rectifier of claim 4 wherein the diodes of one of said sets are forwardly mounted in one heat sink while the diodes of the other said set are reversely mounted in the other heat sink.

11. The rectifier of claim 4 wherein a snubber circuit comprising a series resistor and capacitor is mounted on said printed circuit board so as to be connected in parallel with each of said diodes.

12. The rectifier of claim 4 further comprising output terminals respectively connected to said heat sinks by means of a busing network.

13. The rectifier of claim 12 wherein said busing network provides a mounting for a filtering system.

14. The rectifier of claim 4 wherein said printed circuit board has plural openings to allow said diodes to protrude therethrough.

15. The rectifier of claim 4 wherein said transformer core comprises two opposing U-shaped sections.

16. A densely packaged output stage for a switching regulated power supply comprising:
- dual heat sinks positioned close together in adjacent coplanar relationship;
- plural diodes mounted on and electrically connected to said heat sinks; and
- a transformer comprising a ferromagnetic core, a primary winding, and plural secondary windings, each said secondary winding being electrically connected to one of said diodes and one of said heat sinks such that said heat sinks are of the opposite polarity relative to one another during both half cycles of the non-rectified signal.

17. An output stage for a switching regulated power supply, comprising:
- two coplanar heat sinks in close adjacent relation to one another;
- first and second set of diodes respectively mounted on said heat sinks so that all diode terminals are uniformly physically oriented with respect to said heat sinks, said first set of diodes having one terminal in direct electrical contact with its respective heat sink and said second set of diodes being electrically insulated from said heat sink;
- a printed circuit board mounted on said heat sinks having plural openings to accommodate said diodes and having two conductors, each in electrical contact with one of said heat sinks;
- a ferromagnetic core mounted on said printed circuit board having a primary winding;
- first and second sets of secondary windings on said core, each said winding having two ends;
- one end of first set of windings connected to one terminal of said first set of diodes and one end of said second set of windings connected to the opposite terminal of said second set of diodes; and
- the opposite ends of said first and second set of windings respectively connected to said conductors such that during each half cycle of a non-rectified signal impressed upon said primary winding of said core, one set of diodes is conducting while the other set of diodes is not conducting.

18. A full wave rectifier comprising:
- dual means for the dissipation of heat;
- a first and second set of rectifier diodes respectively mounted on said heat dissipation means so that all diode terminals are uniformly physically oriented; and
- a transformer core having a primary winding and plural secondary windings, each said secondary winding connected to one of said diodes such that during each half cycle of the non-rectified signal, one of said set of diodes is conducting while the other set of diodes is not conducting.

19. A densely packaged full wave rectifier output comprising:
- a transformer core having a primary winding and a plurality of secondary windings disposed around said core;
- a first heat sink and a second heat sink disposed adjacent one another in parallel coplanar relationship and axially adjacent said core; and
- a plurality of diodes uniformly physically mounted on said heat sinks and arranged around the periphery of said transformer, each diode being respectively electrically connected to one of said secondary windings, those of said diodes which rectify one half cycle being electrically mounted on said first heat sink and those of said diodes which rectify the other half cycle being insulated from said second heat sink.

* * * * *